United States Patent
Comino et al.

[11] Patent Number: 6,095,041
[45] Date of Patent: Aug. 1, 2000

[54] STENCIL MASK WITH CHANNELS INCLUDING DEPRESSIONS

[75] Inventors: Thomas Comino, Vestal; Richard M. Schroedl, Staatsburg, both of N.Y.

[73] Assignee: International Business Corporation, Armonk, N.Y.

[21] Appl. No.: 09/359,289

[22] Filed: Jul. 22, 1999

[51] Int. Cl.[7] .............................. B05C 17/06; B41N 1/24
[52] U.S. Cl. ........................................ 101/127; 101/128.4
[58] Field of Search .............................. 101/127, 128.21, 101/128.4, 114

[56] References Cited

U.S. PATENT DOCUMENTS

| | | | |
|---|---|---|---|
| 4,803,110 | 2/1989 | Ahn et al. | 428/137 |
| 4,811,237 | 3/1989 | Putatunda et al. | 364/491 |
| 5,669,970 | 9/1997 | Balog et al. | 101/128.4 |
| 5,819,652 | 10/1998 | Utter et al. | 101/128.21 |

FOREIGN PATENT DOCUMENTS 60-192694  10/1985  Japan .................................. 101/127

OTHER PUBLICATIONS

Fugardi; Improved Silk Screen Mask; IBM Technical Disclosure Bulletin, vol. 6, No. 11, pp. 52–53, Apr. 1964.

Technical Disclosure Bulletin, vol. 32, No. 6A, Nov. 1989, One–Piece Screening Mask with Selectively Located Multiple–Size Mesh Holes and Open Stencils.

*Primary Examiner*—John S. Hilten
*Assistant Examiner*—Daniel J. Colilla
*Attorney, Agent, or Firm*—Ira D. Blecker; Lawrence D. Cutter

[57] ABSTRACT

The positioning of mesh side features in a stencil mask are controlled to produce a mask which possesses high structural integrity and which exhibits a low service life. Mesh side feature control also eliminates certain unnecessary design side channels and mesh side via openings. Mesh side feature placement at T-shaped design side junctions is also controlled to produce a more uniform distribution of material which is screened through the stencil mask.

6 Claims, 5 Drawing Sheets

STENCIL MASK WITH CHANNELS INCLUDING DEPRESSIONS

BACKGROUND OF THE INVENTION

The present invention is generally directed to stencil masks used in the formation of electrically conductive lines on ceramic substrate materials. More particularly, the present invention is directed to a mesh pattern for a stencil mask which is particularly useful for deposition of conductive paste through the mask and onto a ceramic substrate for conductor patterning. Even more particularly, the present invention is directed to a method which facilitates automatic generation for stencil mesh patterns.

In the fabrication of packages for electronic circuit chips it is necessary to deposit finely detailed patterns of conductive material on insulative substrates such as ceramic materials. In order to provide these conductive patterns conductive paste is deposited on the insulative substrate. The conductive paste or other appropriate material provides the basis for further processing steps which provide the substrate with electrically conductive power and signal patterns. However, it is noted that this subsequent processing does not form any part of the present invention. Rather, the present invention is directed to a stencil mask through which various materials are deposited onto an insulated substrate which is typically a ceramic material. The stencil masks of the present invention are typically metal and are preferably made out of a material such as molybdenum.

These metal screening stencil masks are preferably produced by a subtractive process. A molybdenum foil is coated with a positive photoresist and then imaged. The exposed molybdenum is then etched to form the "through" features. The process is then completed by stripping off the photoresist. These masks have two sides. A first side is a "design" side which contains the pattern of conductive paste which is intended for placement on an insulative substrate such as a ceramic greensheet. Such greensheets are employed in high end packaging for multi-chip modules and in thermal conduction modules used in high end computer systems.

The other side of the mask is the so-called mesh side. The mesh side is used to hold and support the mask design side structure during the screening cycle. Certain mask designs are only possible using mesh structures. These include square hatches, cross hatches and stencils masks for power planes.

As indicated above, the patterning on one side of a stencil mask is in fact different from the patterning on the other side. There is thus a "design" side and a "mesh" side. Furthermore, even apart from the differences in two-dimensional patterning which exist on different sides of the stencil mask, there are other differences that exist between the design side and the mesh side. In particular, etching of the design side produces apertures having different profiles when viewed from the mesh side of the mask as opposed to profiles as seen from the opposite or design side of the stencil mask. In particular, the mesh patterning provides significant structural integrity to a stencil mask. In particular, as indicated certain mask designs require the use of mesh structures to insure both structural integrity and the durability of the stencil mask over many application cycles.

In particular stencil masks for square hatching are used to produce fixed layers in certain semi-conductor packaging arrangement. These design layers are typically used to distribute power and to reduce noise inside the packaging configuration. The pattern comprises a series of lines in horizontal and vertical direction intersecting each other at substantially 90° angles. The line spacing is one design grid wide on so called full dense square hatches (FDSH). On half dense square hatches (HDSH) the pattern is two design grids wide. In particular, in these mask designs, through-vias pass in this layer and are formed by isolating the via pattern with metal on the mask thus not allowing the square between two horizontal and vertical lines be filled with paste.

SUMMARY OF THE INVENTION

In accordance with a preferred embodiment of the present invention a stencil mask includes a design side and a mesh side. The design side of the mask includes in a portion thereof channels which are disposed in substantially horizontal and vertical directions so as to define rectangular cells on the design side of the stencil mask. In accordance with preferred embodiments of the present invention the cells in this region of the mask do not include design side channels which extend from one side of the cell to the otherside. Likewise, on the mesh side of the stencil mask these cells are not associated with centrally disposed mesh patterns for via openings. In further aspects of the present invention certain intersections of horizontally and vertically disposed design side lines in the stencil mask do not include corresponding mesh openings disposed at these intersections. Rather, in the present invention, mesh patterns for selected junctions are disposed only in adjacent positions to such intersections which are typically T-shaped intersections. Typically such T-shaped intersections result from patterns disposed on half grid wide spacing.

Accordingly, it is an object of the present invention to provide a stencil mask which exhibits a high degree of structural integrity.

It is also an object of the present invention to provide a stencil mask which exhibits an increased service life.

It is yet another object of the present invention to provide a stencil mask which reduces the amount of material which needs to be screened through the mask.

It is another object of the present invention to provide mesh side features which better control the flow of paste through the screening mask.

It is a still further object of the present invention to provide an organized schema for sizing and placement of mesh side features to better facilitate the customization of stencil masks and to improve manufacturing cycle times.

It is a still further object of the present invention to produce more uniform patterns on insulative substrates such as ceramic greensheets.

It is a still further object of the present invention to improve the patterning of conductive lines on ceramic materials.

It is yet another object of the present invention to provide stencil masks which are particularly applicable to the formation of voltage planes on insulative substrates.

It is yet another object of the present invention to provide a better connection mechanism between flip-chip semiconductor devices and substrates to which they are attached.

It is a still further object of the present invention to increase the resolution of screen printing methods.

It is also an object of the present invention to provide custom mesh patterns so as not to have to employ voltage plane designs which are restricted to so-called step and repeat operations.

It is yet another object of the present invention to generate mask patterns more quickly with fewer hours of computational time required.

Lastly, but not limited hereto, it is an object of the present invention to produce stencil masks exhibiting mesh side design which produces finer, more uniform features with controlled paste flow, so as to enhance the overall resolution of the resulting material patterns applied through the stencil mask.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
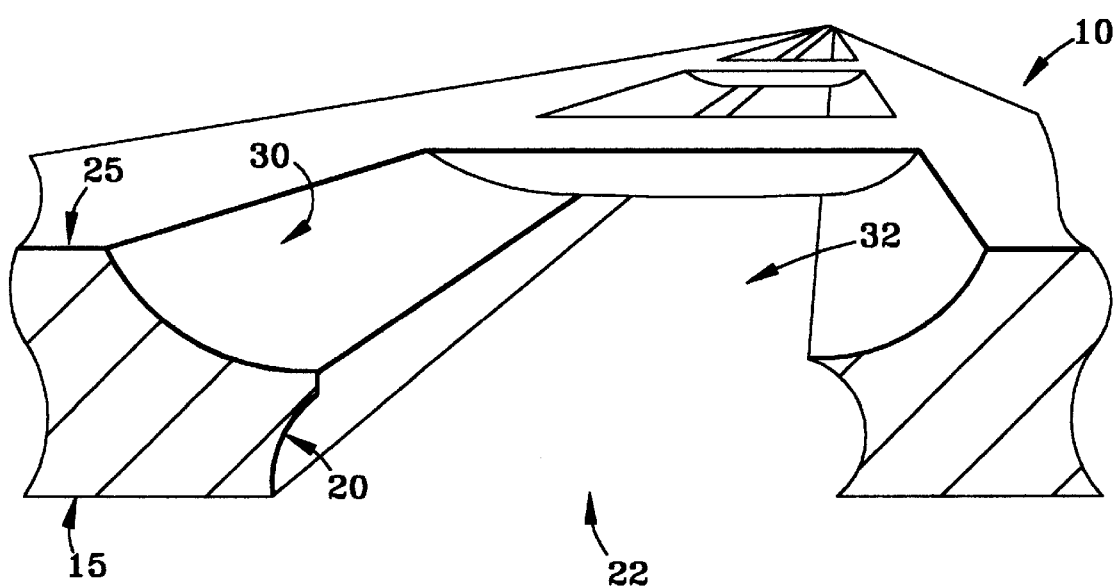
FIG. 1 is a partially cross-sectional and partially isometric view illustrating an opening in a stencil mask created by cooperative patterning on the mesh side and the design side, and more particularly illustrating the profile of an opening in the stencil mask, and even more particularly illustrating flow control profile shapes.

FIG. 1 illustrates the profile structure of an opening in stencil mask 10. In particular, stencil mask 10 includes design side 15 and mesh side 25. Mask 10 preferably comprises a metal and even more particularly, mask 10 preferably comprises a metal such as molybdenum. However, any stable etchable metal that is relatively stiff in 2 to 10 mil thick sheets may be used.

In particular, it is noted that the opening profile from design side 15 is not necessarily the same as the profile provided from mesh side 25. Accordingly, there results a mask opening profile such as that indicated in FIG. 1. However, it is noted that while the profiles are indicated in this figure as being different, there are numerous variations in profile shape and design. The profile illustrated in FIG. 1 is preferable for controlling the flow of paste material through the stencil mask. However, the present design is not limited to the profile shown in FIG. 1 more symmetric profiles may be employed.

Stencil masks of the present invention are preferably made by means of conventional etch processes. In particular, stencil masks of the present invention are constructed by means of applying either a positive or negative photoresist to one side of the mask. A pattern is developed in the photoresist by means of light exposure through a glass material containing the patterns to be formed. A glass template is used for this purpose since glass exhibits better dimensional stability than materials such as polymers which may also be transparent. The stencil mask is then etched where the photoresist has been removed in accordance with standard resist development processes. The strength of the etchant and duration of exposure control opening profiles. In preferred methods for forming the stencil mask of the present invention both sides of the mask are etched at the same time. In preferred masks, profile 20 of channels 22 for design side 15 and profile 30 of depression 32 for mesh side 25 of stencil mask 10 are employed.

Figure 2:
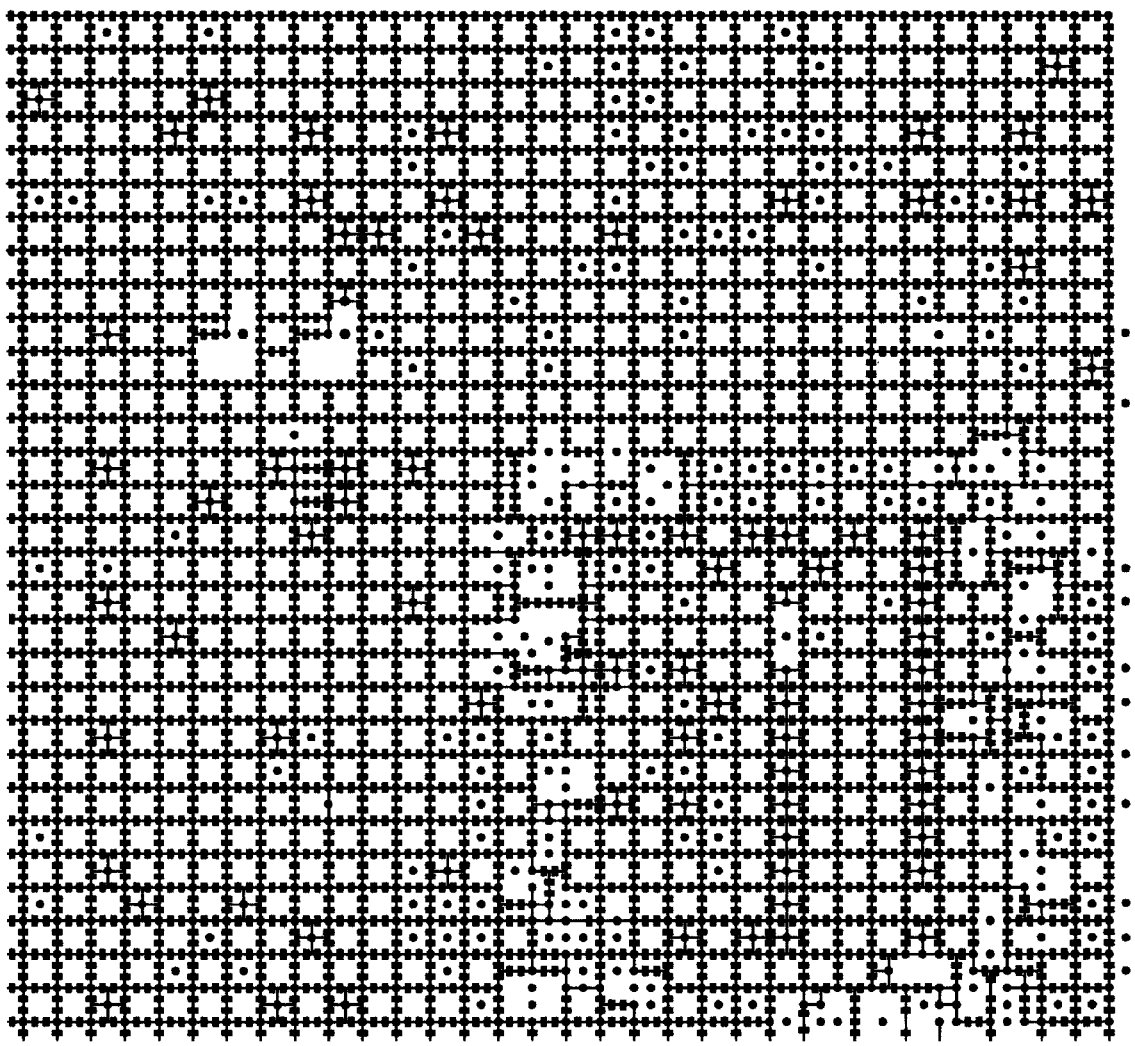
FIG. 2 is a two-dimensional plan view illustrating patterning on both the design side and the mesh side of a stencil mask illustrating a typical pattern and the relation between stencil side and mesh side and design layouts.

FIG. 2 illustrates a stencil mask pattern in accordance with the present invention. In particular FIG. 2 illustrates a portion of a screen mask which shows both design side and mesh side features in a composite structure for purposes of better understanding the operation of the present invention and the cooperative relation between design side and mesh side features. In particular, relatively fine horizontal and vertical lines in FIG. 2 illustrate design side features and in particular the formation of rectangular cells. It is the structure of certain ones of these cells which comprise the inventive aspects of the present invention.

FIG. 2 also illustrates the presence of mesh side features. These features are represented in FIG. 2 as either circular or rectangular masks. However, the specific shape of these patterns is variable and it is possible to employ circular openings in the mesh layer as opposed to rectangular openings (and vice versa) without departing from the teachings of the present invention.

FIG. 2 also illustrates the presence of circular mesh patterns disposed in the central portions of certain rectangular cells. These mesh openings are typically provided for via openings which extend through various layers in the insulative ceramic substrate. In particular, it is noted that in the present invention the presence of such vias are constrained to lie only in needed locations, as opposed to being present in each and every cell. It is also noted that in some cells where central circular mesh side via openings are present there is also provided, on the design side channels which are etched on the design side and which extend from one side of the cell to another (in a direction contained within the plane of the mask). In the present invention these regions are kept to a minimum.

It is also noted that while FIG. 2 illustrates substantially square patterning where the horizontal and vertical grid distances are the same, in general, stencil mask patterning on the design side is not limited to having this grid spacing the same in both the horizontal and vertical directions thus rendering the possibility of including genuinely rectangular cells as part of the mask of the of the present invention.

Figure 3:
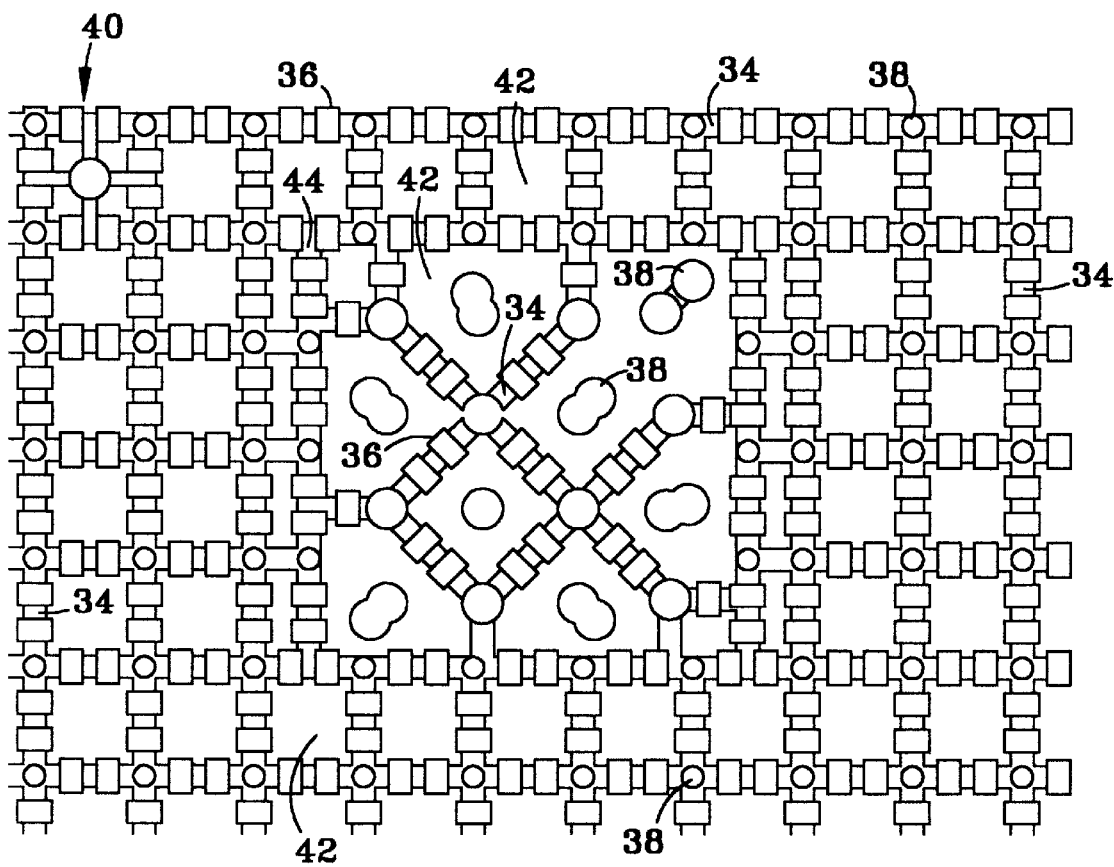
FIG. 3 is a view similar to FIG. 2 but illustrating in greater detail a stencil mask pattern in conformance with the present invention.

FIG. 3 is particularly illustrative of the present invention. In particular, FIG. 3 is a more detailed view of a portion of a stencil mask such as is seen in FIG. 2. However, it is noted that the pattern in FIG. 3 has not in fact been taken from any portion of FIG. 2.

In FIG. 3 closely spaced parallel lines 34 indicate design side patterning. Correspondingly rectangles 36 and circles 38, of FIG. 3 illustrate mesh side patterning. Additionally, it is noted that the cell in the upper left hand portion of FIG. 3 illustrates an example of a cellular pattern 40 which the present invention generally seeks to avoid where possible. Also, the open portions 42 of FIG. 3 illustrate the presence of metal and accordingly illustrates the fact that the stencil masks of the present design provide greater structural integrity and are accordingly seen to possess a longer service life. This result is achieved by providing a uniform distribution of mesh side features, thus rendering the metal portions more readily able to withstand the rigors of use.

It is also noted that certain of the horizontal and vertical intersections shown in FIG. 3, for example 44, do not include mesh openings at the intersections. In particular, such patterns are seen to occur where design side line features have been placed on grid spacings which exhibit half the standard width. In these circumstances, a mesh opening above the intersection is not provided however, there are nonetheless provided mesh openings adjacent to these T-shaped grid intersections. Such patterning also ensures a more uniform structure for the screened material.

It is also noted that the present invention can accommodate grid patterning disposed at non-zero angles with respect to the underlying and overall grid spacing on the design side. This is illustrated in the central portion of FIG. 3. In particular, it is noted that where there are relatively large regions of metal as a result of the variability in grid direction there is an opportunity for the presence of mesh openings. These are illustrated in the central portion of FIG. 3 where in general two overlapping circular mesh features are provided.

In an alternate embodiment of the present invention, instead of using etched metal sheets, one employs an electroforming process which is both additive and subtractive in its operation. Preferable forms of such masks include a patterned copper core layer upon which nickel is plated to achieve desirably higher aspect ratios. The electroformed stencil mask is more expensive but it can achieve higher resolutions because of the ability to better control aspect ratios in the electro deposition portion of the process.

In another aspect of the present invention, analysis of individual line widths and grid spacing is employed to provide a substantially uniform distribution of mask features between grid intersection points. This aspect is particularly suitable for automation which replaces more "manual" efforts at positioning mesh side features. These methods have proven to be detrimental to consistent treatment of stencil mask areas across relatively large areas of the mask. Accordingly, automation of mesh feature placement results in significant improvements in structural integrity for the mask.

Figure 4:
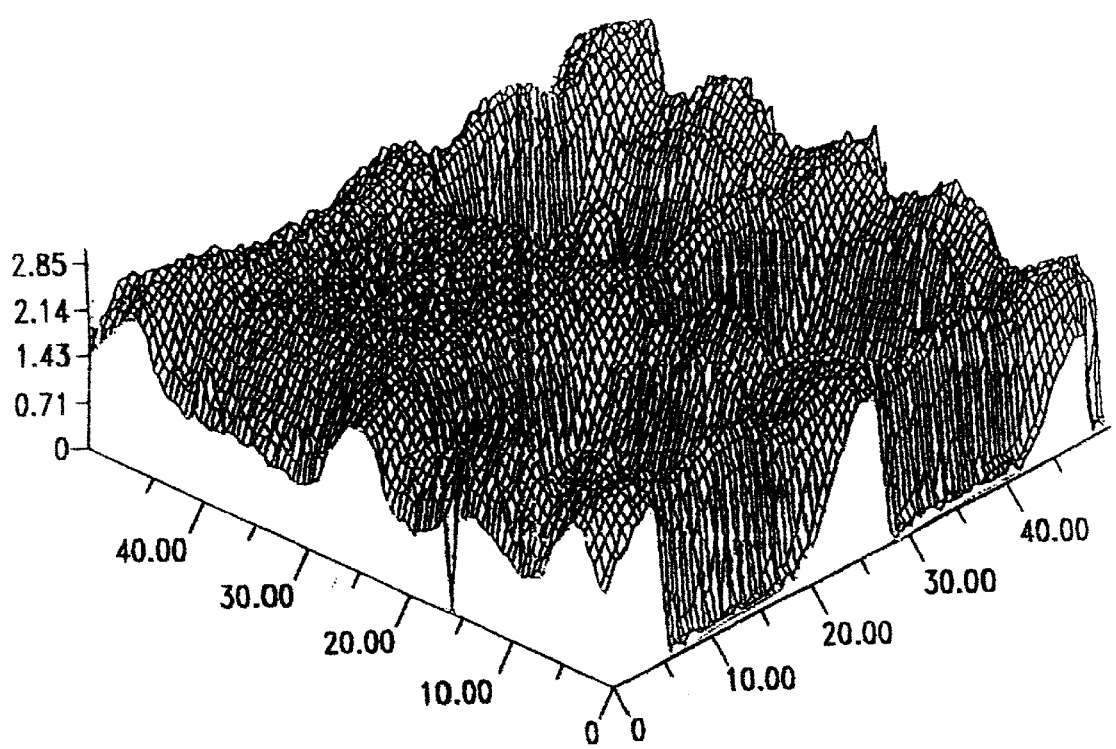
FIG. 4 is an isometric view of a 3D laser scan illustrating the resultant screened paste material layout produced using stencil mask designs that are not in conformance with the present invention.
Figure 5:
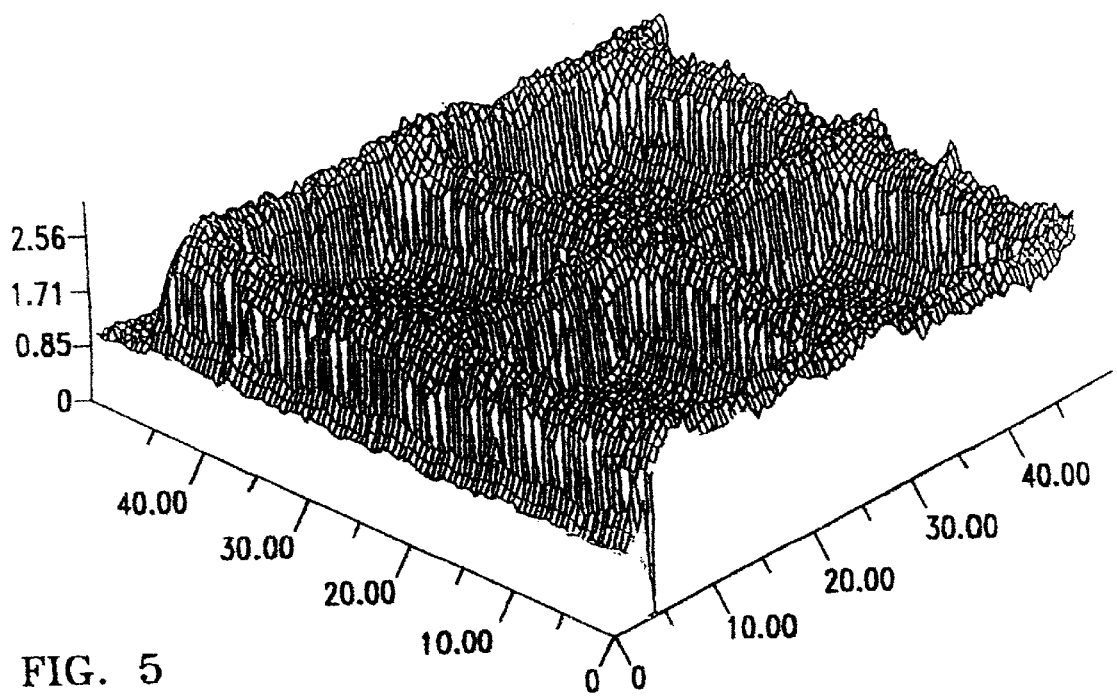
FIG. 5 is a view similar to FIG. 4 but more particularly illustrating the uniformity of line width and height as achieved in conductive pastes applied using stencil masks conforming to the present invention.
Figure 6:
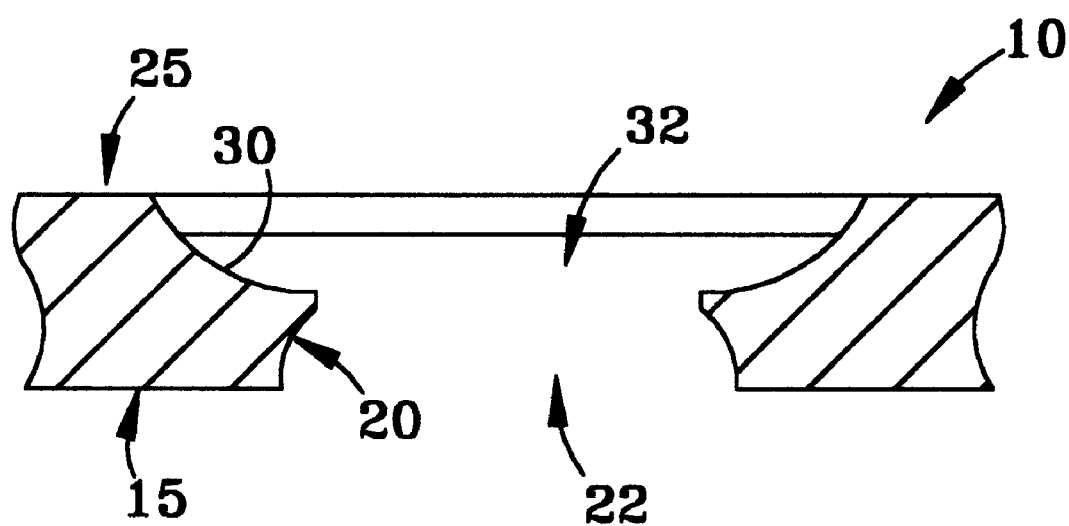
FIG. 6 is a cross-sectional view of a stencil mask.

The efficacy of the present invention is particularly illustrated in a comparison of FIGS. 4 and 5. These Figures represent 3-D laser scans of ceramic greensheets which have been imprinted with screened paste products. In particular, it is noted that the resultant screen material in FIG. 5 illustrates exceptionally good line structure. In particular, not only are the line widths uniform, but it is also seen the that the height of the lines of paste applied to a ceramic greensheet are uniform. It is further seen that this uniformity is achieved by means of flow control which is in turn produced by improved mesh side patterning as illustrated in FIG. 3.

Accordingly, from the above it should be appreciated that the stencil mask of the present invention achieves all of the objects indicated above. In particular, it is seen that cautious use of both design side and mesh side etching produces a stencil mask which is more structurally sound and which exhibits a longer service life.

The invention claimed is:

1. A stencil mask comprising:
   a planar sheet having at least a portion thereof having a rectangular grid formed by substantially horizontal and vertical channels which extend only partially through said sheet on a first side thereof, whereby a plurality of rectangular cells are defined, said sheet also having, within said portion, a plurality of depressions in said sheet, said depressions being disposed over said channels, said depressions extending only partially but sufficiently through said sheet on a second side thereof so as to produce openings along, and communicating with, said channels, and wherein, in said portion, there are no channels on said first side of said sheet which extend across said cells.

2. The mask of claim 1 in which said sheet is metal.

3. The mask of claim 1 in which said sheet is molybdenum.

4. The mask of claim 1 in which said second side depressions are absent from at least one intersection defined by said horizontal and vertical channels.

5. The mask of claim 1 in which said second side depressions are spaced uniformly between intersections defined by said horizontal and vertical channels.

6. The mask of claim 1 in which said sheet is an electroformed structure.

* * * * *